United States Patent
Shibata

(10) Patent No.: US 10,600,461 B2
(45) Date of Patent: Mar. 24, 2020

(54) MAGNETIC DOMAIN WALL DISPLACEMENT TYPE MAGNETIC RECORDING ELEMENT AND MAGNETIC RECORDING ARRAY

(71) Applicant: TDK CORPORATION, Tokyo (JP)

(72) Inventor: Tatsuo Shibata, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/328,696

(22) PCT Filed: Jan. 12, 2018

(86) PCT No.: PCT/JP2018/000629
§ 371 (c)(1),
(2) Date: Feb. 26, 2019

(87) PCT Pub. No.: WO2019/138535
PCT Pub. Date: Jul. 18, 2019

(65) Prior Publication Data
US 2019/0333558 A1 Oct. 31, 2019

(51) Int. Cl.
| | |
|---|---|
| *H01L 27/22* | (2006.01) |
| *G11C 11/16* | (2006.01) |
| *H01F 10/32* | (2006.01) |
| *H01L 43/02* | (2006.01) |

(52) U.S. Cl.
CPC ........ *G11C 11/161* (2013.01); *H01F 10/3286* (2013.01); *H01L 27/222* (2013.01); *H01L 43/02* (2013.01); *H01F 10/325* (2013.01); *H01F 10/3254* (2013.01)

(58) Field of Classification Search
None
See application file for complete search history.

(56) References Cited

U.S. PATENT DOCUMENTS

2010/0091555 A1* 4/2010 Fukami ............... B82Y 10/00
365/158
2011/0129691 A1 6/2011 Ishiwata et al.

FOREIGN PATENT DOCUMENTS

| JP | 5441005 B2 | 3/2014 |
| WO | 2008/099626 A1 | 8/2008 |
| WO | 2009/050287 A1 | 4/2009 |
| WO | 2017/183573 A1 | 10/2017 |

OTHER PUBLICATIONS

Chen et al., "Optimized Learning Scheme for Grayscale Image Recognition in a RRAM Based Analog Neuromorphic System," IEEE, 2015, pp. 17.7.1-17.7.4.
Zhu et al., "Current-induced domain wall motion in nanostrip-nanobars system," Japanese Journal of Applied Physics, 2014, vol. 53, pp. 073001-1-073001-4.

* cited by examiner

*Primary Examiner* — Jack S Chen
(74) *Attorney, Agent, or Firm* — Oliff PLC

(57) ABSTRACT

A magnetic domain wall displacement type magnetic recording element including a first ferromagnetic layer including a ferromagnetic material, a magnetic recording layer configured to extend in a first direction crossing a laminating direction of the first ferromagnetic layer and including a magnetic domain wall, and a nonmagnetic layer sandwiched between the first ferromagnetic layer and the magnetic recording layer, wherein the first ferromagnetic layer has a magnetic flux supply region at least at a first end in the first direction.

11 Claims, 7 Drawing Sheets

MAGNETIC DOMAIN WALL DISPLACEMENT TYPE MAGNETIC RECORDING ELEMENT AND MAGNETIC RECORDING ARRAY

BACKGROUND OF THE INVENTION

Field of the Invention

The present invention relates to a magnetic domain wall displacement type magnetic recording element and a magnetic recording array.

Description of Related Art

As a next-generation nonvolatile memory to replace a flash memory or the like which shows a limitation in miniaturization, a resistance change type recording apparatus which stores data using a resistance change type element is attracting attention. Examples of such a recording apparatus include a magnetoresistive random access memory (MRAM), a resistance random access memory (ReRAM), a phase change random access memory (PCRAM), and so on. Also, attempts have been made to realize a device (a neuromorphic device) which mimics a human brain mechanism using such a resistance change element (Non-Patent Document 1).

As a method for increasing a density (increasing a capacity) of a memory, there is a method of reducing sizes of components constituting the memory. Besides this, there is a method of multivaluing recording bits per element constituting the memory. Also, for a neuromorphic device using a resistance change element, there is a method of performing a product-sum operation in an analog manner by constituting an array using a fact that a resistance value of the resistance change element changes continuously.

Patent Document 1 describes a magnetic domain wall displacement type magnetic recording element capable of recording multivalued data by controlling a position of a magnetic domain wall in a magnetic recording layer. Patent Document 2 describes a magnetic domain wall utilization type analog memory device taking into consideration that the resistance value changes continuously according to the position of the magnetic domain wall in the magnetic recording layer, and a magnetic neuron element using the same.

CITATION LIST

Patent Documents

[Patent Document 1] PCT International Publication No. WO2009/050287
[Patent Document 2] PCT International Publication No. WO2017/183573

Non-Patent Documents

[Non-Patent Document 1] Zhe Chen et al, IEEE, 2015, p. 17.7.1-p. 17.7.4

SUMMARY OF THE INVENTION

In a magnetic domain wall displacement type recording element, when the magnetic domain wall moves to a region in which a resistance change is not expected, an insensitive state in which the element does not respond to an input occurs. Therefore, it is required to stabilize an operation of the resistance change element by limiting the movement range of the magnetic domain wall to a range in which the resistance varies according to a position of the magnetic domain wall and adopting a mechanism in which the magnetic domain wall does not move to a region in which resistance change is not expected.

In the magnetic domain wall displacement type magnetic recording element described in Patent Document 1, unevenness is provided on a side surface of the magnetic recording layer. The unevenness serves as a trap site of the magnetic domain wall and controls the movement range of the magnetic domain wall. However, when the physical unevenness is provided on the magnetic recording layer, a current concentration may occur in a recessed portion. The current concentration causes heat generation, makes the operation of the element unstable, and thus decreases reliability of data.

The present invention has been made in view of the above-described problems, and it is an object of the present invention to provide a magnetic domain wall displacement type magnetic recording element and a magnetic recording array which can stably control movement of a magnetic domain wall within a predetermined range.

(1) A magnetic domain wall displacement type magnetic recording element according to a first aspect includes a first ferromagnetic layer including a ferromagnetic material, a magnetic recording layer configured to extend in a first direction crossing a laminating direction of the first ferromagnetic layer and including a magnetic domain wall, and a nonmagnetic layer sandwiched between the first ferromagnetic layer and the magnetic recording layer, wherein the first ferromagnetic layer has a magnetic flux supply region at least at a first end in the first direction.

(2) In the magnetic domain wall displacement type magnetic recording element according to the above-described aspect, the first ferromagnetic layer may have a magnetic flux supply region at the first end and a second end opposite to the first end.

(3) In the magnetic domain wall displacement type magnetic recording element according to the above-described aspect, the magnetic flux supply region may include a material different from that of a main region located at a center of the first ferromagnetic layer in the first direction.

(4) In the magnetic domain wall displacement type magnetic recording element according to the above-described aspect, the first ferromagnetic layer may include a first layer and a second layer, which are made of ferromagnetic materials and have mutually different magnetization directions, and an intermediate layer sandwiched between the first layer and the second layer, and an area occupied by the first layer and an area occupied by the second layer may be different from each other in a cutting plane obtained by cutting the magnetic flux supply region through a center of gravity of the first ferromagnetic layer in the first direction.

(5) In the magnetic domain wall displacement type magnetic recording element according to the above-described aspect, the first layer may be located closer to the magnetic recording layer than the second layer is, and a length of the first layer may be longer than a length of the second layer.

(6) In the magnetic domain wall displacement type magnetic recording element according to the above-described aspect, the first layer may be located closer to the magnetic recording layer than the second layer is, and a length of the second layer may be longer than a length of the first layer.

(7) In the magnetic domain wall displacement type magnetic recording element according to the above-described aspect, the first layer and the second layer may protrude stepwise in the first direction, and a side surface of the first ferromagnetic layer may be stepped in the first direction.

(8) In the magnetic domain wall displacement type magnetic recording element according to the above-described aspect, the side surface of the first ferromagnetic layer may be an inclined surface in the first direction.

(9) In the magnetic domain wall displacement type magnetic recording element according to the above-described aspect, the first ferromagnetic layer and the magnetic recording layer may have magnetic anisotropy in the laminating direction.

(10) In the magnetic domain wall displacement type magnetic recording element according to the above-described aspect, the first ferromagnetic layer and the magnetic recording layer may have magnetic anisotropy in in-plane directions of the first ferromagnetic layer and the magnetic recording layer.

(11) In the magnetic domain wall displacement type magnetic recording element according to the above-described aspect, a second ferromagnetic layer exhibiting a magnetization state of the magnetic recording layer may be provided between the magnetic recording layer and the nonmagnetic layer.

(12) A magnetic recording array according to a second aspect includes a plurality of the magnetic domain wall displacement type magnetic recording elements according to the above-described aspect.

According to the magnetic domain wall displacement type magnetic recording element of the above-described aspect, it is possible to stably control a movement range of the magnetic domain wall.

DETAILED DESCRIPTION OF THE INVENTION

Figure 1:
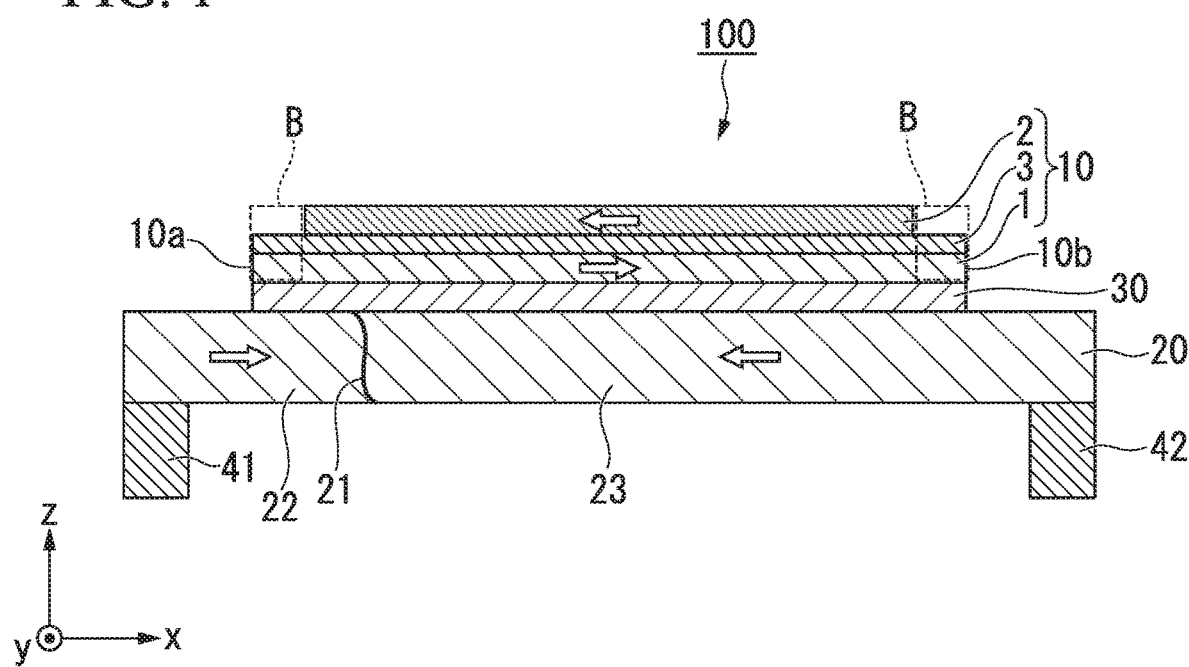
FIG. 1 is a cross-sectional view schematically showing a magnetic domain wall displacement type magnetic recording element according to a first embodiment.

Hereinafter, embodiments will be described in detail with reference to the drawings. In the drawings used in the following description, for the sake of clarity of features of the present invention, characteristic portions may be enlarged for convenience, and dimensional proportions of respective components may be different from actual sizes. Materials, dimensions, and so on exemplified in the following description are mere examples, and may be appropriately changed within a range that produces effects of the present invention, and the present invention is not limited thereto.

(Magnetic Domain Wall Displacement Type Magnetic Recording Element)

First Embodiment

FIG. 1 is a cross-sectional view schematically showing a magnetic domain wall displacement type magnetic recording element 100 according to a first embodiment. The magnetic domain wall displacement type magnetic recording element 100 includes a first ferromagnetic layer 10, a magnetic recording layer 20, and a nonmagnetic layer 30. The magnetic domain wall displacement type magnetic recording element 100 shown in FIG. 1 includes a first via wiring 41 and a second via wiring 42 at positions between which the first ferromagnetic layer 10 is sandwiched in a plan view.

Hereinafter, a first direction in which the magnetic recording layer 20 extends is referred to as an x direction, a second direction orthogonal to the x direction within a plane in which the magnetic recording layer 20 extends is referred to as a y direction, and a direction orthogonal to the x direction and the y direction is referred to as a z direction. A laminating direction of the magnetic domain wall displacement type magnetic recording element 100 shown in FIG. 1 coincides with the z direction.

<First Ferromagnetic Layer>

The first ferromagnetic layer 10 shown in FIG. 1 includes a first layer 1, a second layer 2, and an intermediate layer 3. Both of the first layer 1 and the second layer 2 are formed of ferromagnetic materials, and magnetization directions thereof are different from each other. The intermediate layer 3 is sandwiched between the first layer 1 and the second layer 2.

The first layer 1 is closer to the magnetic recording layer 20 than the intermediate layer 3, and the second layer 2 is located farther away from the magnetic recording layer 20 than the intermediate layer 3 is. A length of the first layer 1 in the x direction is longer than a length of the second layer 2 in the x direction. The first layer 1 and the second layer 2 protrude stepwise in the x direction, and a side surface of the first ferromagnetic layer 10 in the x direction is stepped. The first layer 1 and the second layer 2 are in-plane magnetization films having easy magnetization axes in the x direction. The first layer 1 shown in FIG. 1 is oriented in the positive x direction, the second layer 2 is oriented in the negative x direction, and the first layer 1 and the second layer 2 are antiferromagnetically coupled to each other.

A ferromagnetic material is used for the first layer 1 and the second layer 2. For example, a metal selected from a group of Cr, Mn, Co, Fe and Ni, an alloy containing at least one of these metals, an alloy containing these metals and at least one element of B, C, and N and so on can be used for the first layer 1 and the second layer 2. Specifically, Co—Fe, Co—Fe—B, and Ni—Fe may be used for the first layer 1 and the second layer 2. Also, the first layer 1 and the second layer 2 may be perpendicular magnetization films having perpendicular magnetic anisotropy. In this case, a Co/Ni laminated film, a Co/Pt laminated film, or the like is preferably used for the first layer 1 and the second layer 2. For example, with [Co (0.24 nm)/Pt (0.16 nm)]$_X$ (where X is the number of laminations), this can be assumed to constitute the perpendicular magnetization film.

A nonmagnetic material is used for the intermediate layer 3. For example, Ru, Ta, W, Os, or the like can be used for the intermediate layer 3. A film thickness of the intermediate layer 3 is preferably 0.3 nm or more and 2.0 nm or less. When the film thickness of the intermediate layer 3 is within this range, the first layer 1 and the second layer 2 are magnetically coupled.

The first ferromagnetic layer 10 shown in FIG. 1 has a rectangular shape of which a length in the x direction is longer than a length in the y direction. The length of the first ferromagnetic layer 10 in the x direction is preferably 60 nm or more and 1 μm or less. The plan view shape of the first ferromagnetic layer 10 is not limited to a rectangular shape and may be an oval shape having a long axis in the x direction, or the like. One end of the first ferromagnetic layer 10 in the x direction is a first end 10a, and the other end on the opposite side is a second end 10b.

The first ferromagnetic layer 10 shown in FIG. 1 has a magnetic flux supply region B at the first end 10a and the second end 10b. The magnetic flux supply region B generates a magnetic field. A magnetic flux generated from the magnetic flux supply region B penetrates the magnetic recording layer 20.

The magnetic flux supply region B shown in FIG. 1 is a portion in which the first layer 1 and the second layer 2 do not face each other by having the intermediate layer 3 interposed therebetween. An area of the second layer 2 in the magnetic flux supply region B is 0, and the area of the first layer 1 occupying the magnetic flux supply region B and the area of the second layer 2 occupying the magnetic flux supply region B are different from each other.

In a main region located at a center of the first ferromagnetic layer 10, the magnetization of the first layer 1 and the magnetization of the second layer 2 are antiferromagnetically coupled. Therefore, hardly any leakage magnetic field is generated from the main region of the first ferromagnetic layer 10. In contrast, in the magnetic flux supply region B, the magnetization of the first layer 1 is present in excess with respect to the magnetization of the second layer 2. Therefore, a leakage magnetic field is generated from the magnetic flux supply region B.

A width of the magnetic flux supply region B in the x direction (in FIG. 1, a width at which the first layer 1 protrudes in the x direction with respect to the second layer 2) is preferably 0.1% or more and 30% or less of the length of the first ferromagnetic layer 10 in the x direction, and more preferably 1% or more and 10% or less.

As a concrete numerical value, the width of the magnetic flux supply region B in the x direction is preferably 1 nm or more and 100 nm or less, and more preferably 5 nm or more and 50 nm or less.

When the width of the magnetic flux supply region B in the x direction is narrow, the intensity of the magnetic field generated in the magnetic flux supply region B decreases. On the other hand, when the width of the magnetic flux supply region B in the x direction is wide, an area of a portion of the magnetic domain wall displacement type magnetic recording element 100 which is not involved in data storage is widened, and a size of the element is increased.

In the magnetic flux supply region B, a position of an end surface of the intermediate layer 3 in the x direction preferably coincides with a position of an end surface of the first layer 1 or the second layer 2 in the x direction. The magnetization of the first layer 1 is greatly affected by an interface. A magnetization direction of the first layer 1 is stabilized by a surface of the first layer 1 opposite to the magnetic recording layer 20 being in one of a state in which the surface of the first layer 1 is completely covered with the intermediate layer 3 or a state in which the surface of the first layer 1 is not completely covered.

<Magnetic Recording Layer>

The magnetic recording layer 20 extends in the x direction. The magnetic recording layer 20 has a magnetic domain wall 21 therein. The magnetic domain wall 21 is a boundary between a first magnetic domain 22 and a second magnetic domain 23 having magnetizations in opposite directions to each other. The magnetic recording layer 20 shown in FIG. 1 is the in-plane magnetized film in which the first magnetic domain 22 has magnetization oriented in the positive x direction and the second magnetic domain 23 has magnetization oriented in the negative x direction.

The magnetic domain wall displacement type magnetic recording element 100 records data with multiple values according to a position of the magnetic domain wall 21 of the magnetic recording layer 20. The data recorded in the magnetic recording layer 20 is read out as a change in a resistance value in the laminating direction of the first ferromagnetic layer 10 and the magnetic recording layer 20. Here, an output resistance value depends on a relative angle between the magnetizations of the two ferromagnetic layers sandwiching the nonmagnetic layer 30. Therefore, in FIG. 1, the resistance value depending on the relative angle between the magnetization of the magnetic recording layer 20 and the magnetization of the first layer 1 is read out as data.

When the magnetic domain wall 21 moves, a ratio of the first magnetic domain 22 to the second magnetic domain 23 in the magnetic recording layer 20 changes. The magnetization of the first layer 1 is oriented in the same direction (parallel) as that of the magnetization of the first magnetic domain 22 and is oriented in the opposite direction (antiparallel) to that of the magnetization of the second magnetic domain 23. When the magnetic domain wall 21 moves in the x direction and the area of the first magnetic domain 22 in the portion overlapping the first ferromagnetic layer 10 as seen in the z direction increases, the resistance value of the magnetic domain wall displacement type magnetic recording element 100 decreases. On the contrary, when the magnetic domain wall 21 moves in the negative x direction and the area of the second magnetic domain 23 in the portion overlapping the first ferromagnetic layer 10 as seen in the z direction increases, the resistance value of the magnetic domain wall displacement type magnetic recording element 100 increases.

The magnetic domain wall 21 is moved by flowing a current in an extending direction of the magnetic recording layer 20 or by applying an external magnetic field. For example, when a current pulse is applied from the first via wiring 41 to the second via wiring 42, the second magnetic domain 23 expands in a direction of the first magnetic domain 22, and the magnetic domain wall 21 moves in a direction of the first magnetic domain 22. That is, a position of the magnetic domain wall 21 is controlled by setting the direction and intensity of the current flowing through the first via wiring 41 and the second via wiring 42, and data is written in the magnetic domain wall displacement type magnetic recording element 100.

When the data is read from the magnetic domain wall displacement type magnetic recording element 100, a read current flows from the first ferromagnetic layer 10 toward the first via wiring 41 or the second via wiring 42.

A magnetic field generated in the magnetic flux supply region B is applied to the magnetic recording layer 20. The magnetic field creates a magnetic potential distribution in the magnetic recording layer 20. The magnetic domain wall 21 is stabilized in a place in which the potential distribution sensed by the magnetic domain wall 21 in the magnetic recording layer 20 is low. The movement range of the magnetic domain wall 21 can be limited to a portion overlapping the first ferromagnetic layer 10 as seen in the z direction by applying a magnetic field to the magnetic recording layer 20 from the magnetic flux supply region B located at an end of the first ferromagnetic layer 10.

The magnetization state between the magnetic recording layer 20 and the first layer 1 does not change even when the magnetic domain wall 21 moves in a portion which does not overlap the first ferromagnetic layer 10 as seen in the z direction. That is, even when the magnetic domain wall 21 moves in this portion, there is no change in the output data. Sensitivity to a signal input to the magnetic domain wall displacement type magnetic recording element 100 can be enhanced by limiting the movement range of the magnetic domain wall 21.

Figure 2:
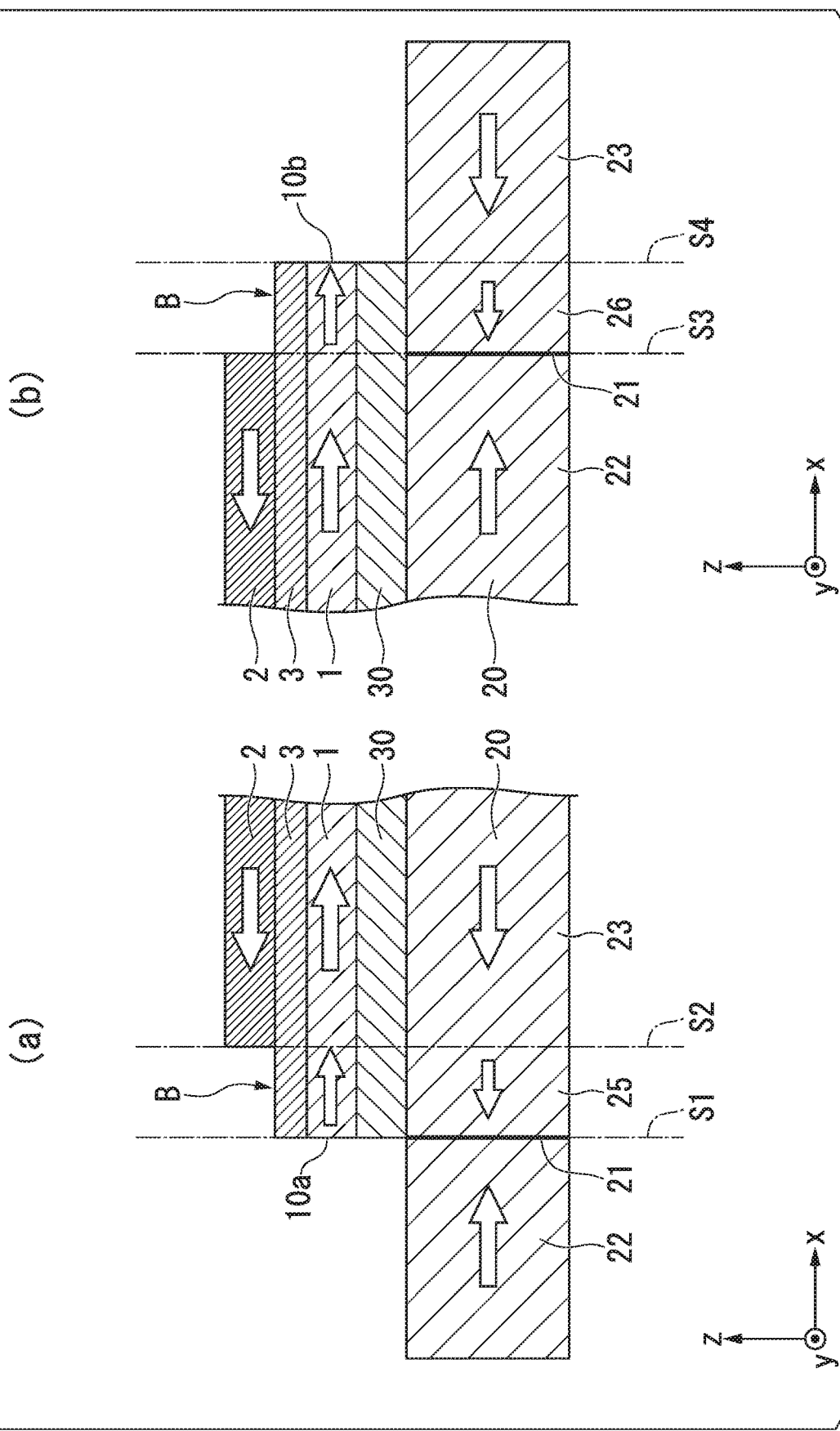
FIG. 2 is an enlarged schematic view of both ends of the magnetic domain wall displacement type magnetic recording element shown in FIG. 1.

FIG. 2 is an enlarged schematic view of both ends of the magnetic domain wall displacement type magnetic recording element 100 shown in FIG. 1. The reason for the movement range of the magnetic domain wall 21 being limited to the portion overlapping the first ferromagnetic layer 10 as seen in the z direction will be described with reference to FIG. 2.

FIG. 2(*a*) is an enlarged schematic view of a main portion on the side of the first end 10*a* of the magnetic domain wall displacement type magnetic recording element 100. In the FIG. 2(*a*), a y-z plane passing through an end of the magnetic flux supply region B in the negative x direction is defined as a first plane S1, and a y-z plane passing through an end of the magnetic flux supply region B in the positive x direction is defined as a second plane S2.

When the magnetic domain wall 21 reaches the first plane S1, the magnetization of a region 25 sandwiched between the first plane S1 and the second plane S2 of the magnetic recording layer 20 is oriented in the negative x direction. In contrast, the magnetization of the first layer 1 in the magnetic flux supply region B is oriented in the positive x direction. That is, the magnetization of the region 25 and the magnetization of the magnetic flux supply region B are oriented (magnetostatically coupled) in opposite directions to each other, and the magnetization state of each of them is stabilized.

On the other hand, FIG. 2(*b*) is an enlarged schematic view of a main portion on the side of the second end 10*b* of the magnetic domain wall displacement type magnetic recording element 100. In FIG. 2(*b*), a y-z plane passing through the end of the magnetic flux supply region B in the negative x direction is defined as a third plane S3, and a y-z plane passing through the end portion in the positive x direction of the magnetic flux supply region B is defined as a fourth plane S4.

When the magnetic domain wall 21 reaches the third plane S3, the magnetization of a region 26 sandwiched between the third plane S3 and the fourth plane S4 of the magnetic recording layer 20 is oriented in the negative x direction. In contrast, the magnetization of the first layer 1 in the magnetic flux supply region B is oriented in the positive x direction. That is, the magnetization of the region 26 and the magnetization of the magnetic flux supply region B are oriented (magnetostatically coupled) in opposite directions to each other, and the magnetization state of each of the magnetization of the region 26 and the magnetization of the magnetic flux supply region B is stabilized.

In this way, the potential distribution sensed by the magnetic domain wall 21 in the magnetic recording layer 20 is lowered when the magnetic domain wall 21 is located at positions of the first plane S1 and the third plane S3. Therefore, the movement range of the magnetic domain wall 21 can be limited to a region between the first plane S1 and the third plane S3. The region between the first plane S1 and the third plane S3 is a portion which overlaps the first ferromagnetic layer 10 when seen in the z direction.

The magnetic recording layer 20 is formed of a magnetic material. The magnetic material constituting the magnetic recording layer 20 may be the same as the substances of the first layer 1 and the second layer 2. Also, it is preferable that the magnetic recording layer 20 has at least one element selected from a group of Co, Ni, Pt, Pd, Gd, Tb, Mn, Ge, and Ga. For example, a laminated film of Co and Ni, a laminated film of Co and Pt, a laminated film of Co and Pd, a MnGa-based material, a GdCo-based material, and a TbCo-based material can be used. Ferrimagnetic materials such as the MnGa-based material, the GdCo-based material, and the TbCo-based material have small saturation magnetization and can lower a threshold current required for moving the magnetic domain wall. Further, the laminated film of Co and Ni, the laminated film of Co and Pt, and the laminated film of Co and Pd have a large coercive force and can suppress a movement speed of the magnetic domain wall.

<Nonmagnetic Layer>

A known material can be used for the nonmagnetic layer 30.

For example, when the nonmagnetic layer 30 is formed of an insulator (in the case of a tunnel barrier layer), $Al_2O_3$, $SiO_2$, MgO, $MgAl_2O_4$, or the like can be used as a material thereof. Also, in addition to these materials, a material in which some of Al, Si, and Mg is substituted with Zn, Be, or the like can also be used. Among them, since MgO and $MgAl_2O_4$ are materials which can realize a coherent tunnel, spin can be efficiently injected. When the nonmagnetic layer 30 is formed of a metal, Cu, Au, Ag, or the like can be used as a material thereof. Furthermore, when the nonmagnetic layer 30 is formed of a semiconductor, Si, Ge, $CuInSe_2$, $CuGaSe_2$, $Cu(In, Ga)Se_2$, or the like can be used as a material thereof.

A thickness of the nonmagnetic layer 30 is preferably 0.5 nm or more and 5 nm or less, and more preferably 1 nm or more and 4 nm or less. When the thickness of the nonmagnetic layer 30 is sufficiently small, the magnetic field generated in the magnetic flux supply region B can be sufficiently applied to the magnetic recording layer 20.

As described above, according to the magnetic domain wall displacement type magnetic recording element 100 of the first embodiment, the movement range of the magnetic domain wall 21 can be limited to the portion which overlaps the first ferromagnetic layer 10 when seen in the z direction. Therefore, the relationship between the movement of the magnetic domain wall 21 and the change in the data output from the magnetic domain wall displacement type magnetic recording element 100 is strengthened, and the sensitivity to an input signal of the magnetic domain wall displacement type magnetic recording element 100 can be increased.

Also, in the magnetic domain wall displacement type magnetic recording element 100 according to the first embodiment, the movement of the magnetic domain wall 21 is limited by the magnetic field generated from the magnetic flux supply region B provided at the end of the first ferromagnetic layer 10. Since there is no change in a physical (structural) shape such as a recessed portion in the magnetic recording layer 20, it is possible to avoid a current concentration on a specific portion of the magnetic recording layer 20. Further, it is possible to easily form the magnetic flux supply region B at a position sufficiently close to the magnetic recording layer 20 by sandwiching the nonmagnetic layer 30. For example, it is very difficult to form the magnetic flux supply region B in an in-plane direction of the magnetic recording layer 20 from the viewpoint of processing accuracy. Also, since the magnetic flux supply region B is present at the position sufficiently close to the magnetic recording layer 20, it is possible to sufficiently generate the magnetic potential distribution in the magnetic recording layer 20.

Although the magnetic domain wall displacement type magnetic recording element according to the first embodiment has been described above in detail with reference to the drawings, the constitutions and combinations thereof in each of the embodiments are just examples, and additions, omissions, substitutions, and other changes to the constitutions are possible without departing from the spirit of the present invention.

Figure 3:
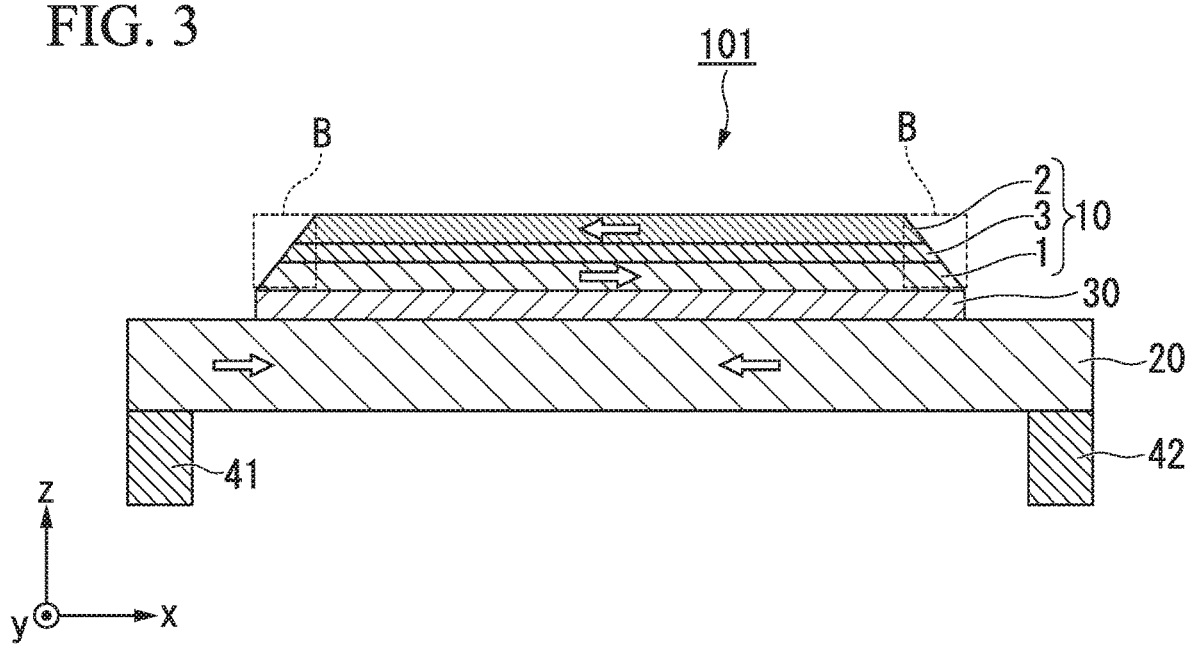
FIG. 3 is a cross-sectional view schematically showing another example of the magnetic domain wall displacement type magnetic recording element according to the first embodiment.

For example, FIG. 3 is a schematic cross-sectional view of another example of the magnetic domain wall displacement type magnetic recording element according to the first embodiment. The magnetic domain wall displacement type magnetic recording element 101 shown in FIG. 3 is different from the magnetic domain wall displacement type magnetic recording element 100 shown in FIG. 1 in that the side surface of the first ferromagnetic layer 10 in the x direction is an inclined surface. Other constitutions are the same as those in FIG. 1, and the same reference numerals are given.

The side surface of the first ferromagnetic layer 10 can be easily formed into an inclined surface using a method such as side milling or the like. Therefore, the magnetic flux supply region B can be easily formed without using a method such as photolithography.

The area of the first layer 1 occupying the magnetic flux supply region B is different from the area of the second layer 2 occupying the magnetic flux supply region B in the magnetic flux supply region B of the magnetic domain wall displacement type magnetic recording element 101 shown in FIG. 3. The area of the first layer 1 is larger than the area of the second layer. The magnetic field corresponding to a difference between the magnetic field generated by the magnetization of the first layer 1 and the magnetic field generated by the magnetization of the second layer 2 is applied as a leakage magnetic field to the magnetic recording layer 20. That is, the movement range of the magnetic domain wall 21 can be limited also in the magnetic domain wall displacement type magnetic recording element 101 shown in FIG. 3, and the sensitivity to the input signal of the magnetic domain wall displacement type magnetic recording element 101 can be increased.

Figure 4:
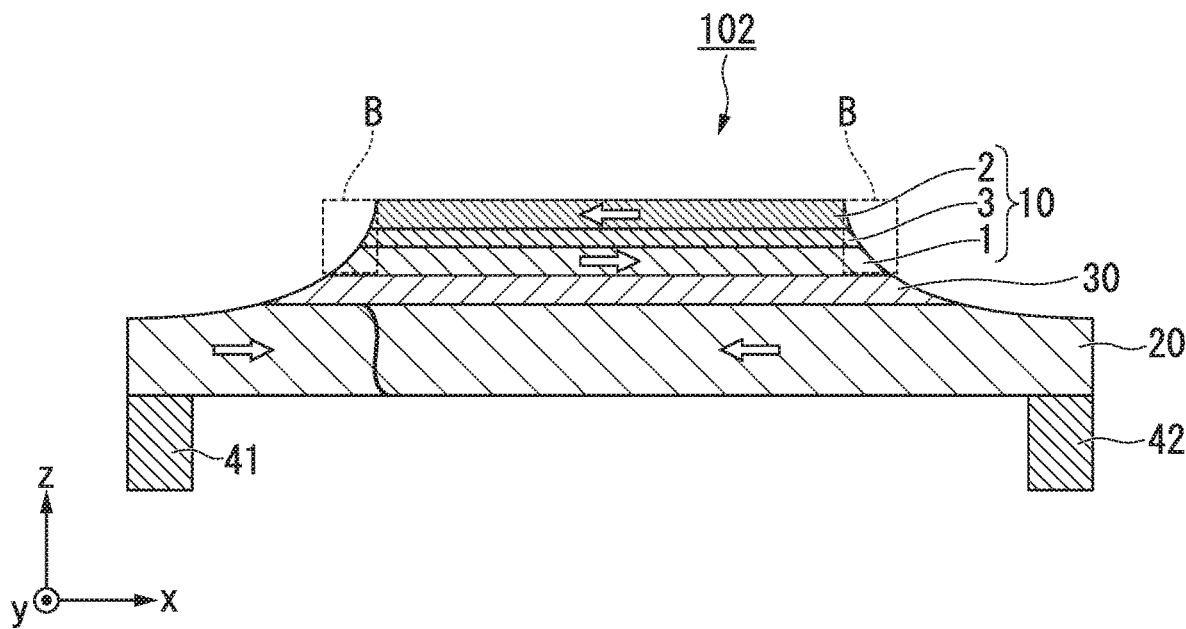
FIG. 4 is a cross-sectional view schematically showing another example of the magnetic domain wall displacement type magnetic recording element according to the first embodiment.

Also, FIG. 4 is a schematic cross-sectional view of another example of the magnetic domain wall displacement type magnetic recording element according to the first embodiment. As in the magnetic domain wall displacement type magnetic recording element 102 shown in FIG. 4, the inclined surface constituting the side surface of the first ferromagnetic layer 10 in the x direction may extend to the magnetic recording layer 20. As the thickness of the magnetic recording layer 20 in the portion which does not overlap the first ferromagnetic layer 10 when seen in the z direction gradually decreases, the movement range of the magnetic domain wall 21 can be further limited to the portion which overlaps the first ferromagnetic layer 10 when seen in the z direction.

When the thickness of the magnetic recording layer 20 fluctuates, a problem of heat generation due to the current concentration occurs. However, since the thickness of the magnetic recording layer 20 in the magnetic domain wall displacement type magnetic recording element 102 changes gently, the heat generation due to the current concentration can be sufficiently minimized. Here, the gentle change in the thickness means that the thickness variation per unit length (1 nm) is 0.05 nm or less.

Figure 5:
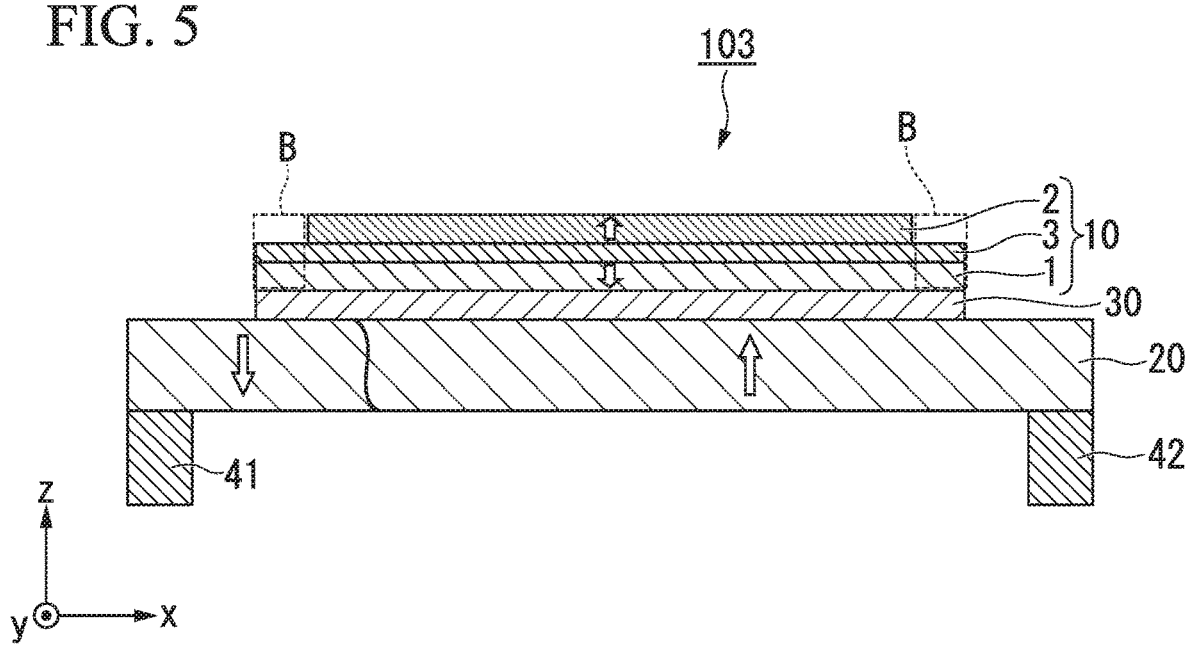
FIG. 5 is a cross-sectional view schematically showing another example of the magnetic domain wall displacement type magnetic recording element according to the first embodiment.

Also, FIG. 5 is a schematic cross-sectional view of another example of the magnetic domain wall displacement type magnetic recording element according to the first embodiment. The magnetic domain wall displacement type magnetic recording element 103 shown in FIG. 5 is different from the magnetic domain wall displacement type magnetic recording element 101 shown in FIG. 1 in that the first ferromagnetic layer 10 and the magnetic recording layer 20 have magnetic anisotropy in the laminating direction. Even when the first layer 1 and the second layer 2 constituting the first ferromagnetic layer 10, and the magnetic recording layer 20 are the perpendicular magnetization films, the movement range of the magnetic domain wall 21 can be sufficiently controlled by the magnetic flux supply region B.

Figure 6:
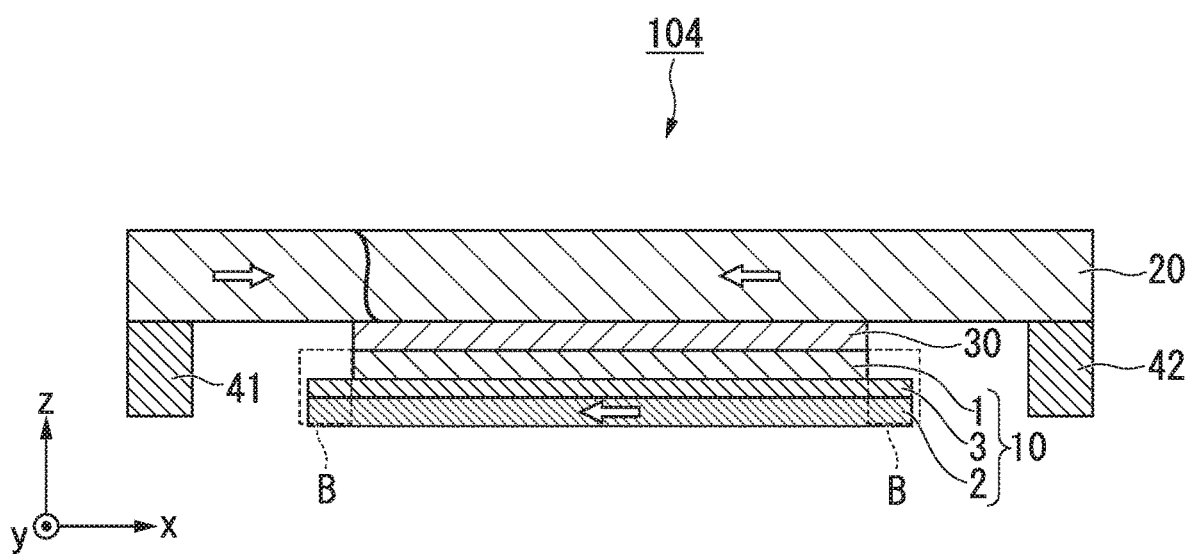
FIG. 6 is a cross-sectional view schematically showing another example of the magnetic domain wall displacement type magnetic recording element according to the first embodiment.

Also, FIG. 6 is a schematic cross-sectional view of another example of the magnetic domain wall displacement type magnetic recording element according to the first embodiment. The magnetic domain wall displacement type magnetic recording element 104 shown in FIG. 6 is different from the magnetic domain wall displacement type magnetic recording element 100 shown in FIG. 1 in the laminating order of the first ferromagnetic layer 10, the magnetic recording layer 20, and the nonmagnetic layer 30. As shown in FIG. 6, the first via wiring 41 and the second via wiring 42 may be located on a surface of the magnetic recording layer 20 on which the nonmagnetic layer 30 or the like is formed.

In the magnetic domain wall displacement type magnetic recording element 104 shown in FIG. 6, the first layer 1 is located closer to the magnetic recording layer 20 than the second layer 2 is, and the length of the second layer 2 is longer than that of the first layer 1. The magnetic flux supply region B is magnetically unstable since the first layer 1 and the second layer 2 do not face each other by having the intermediate layer 3 interposed therebetween. The magnetization of the magnetic recording layer 20 is stabilized by this magnetically unstable portion being not in contact with the nonmagnetic layer 30. Also in the magnetic domain wall displacement type magnetic recording element 104 shown in FIG. 6, the side surface of the first ferromagnetic layer 10 may be an inclined surface.

Second Embodiment

Figure 7:
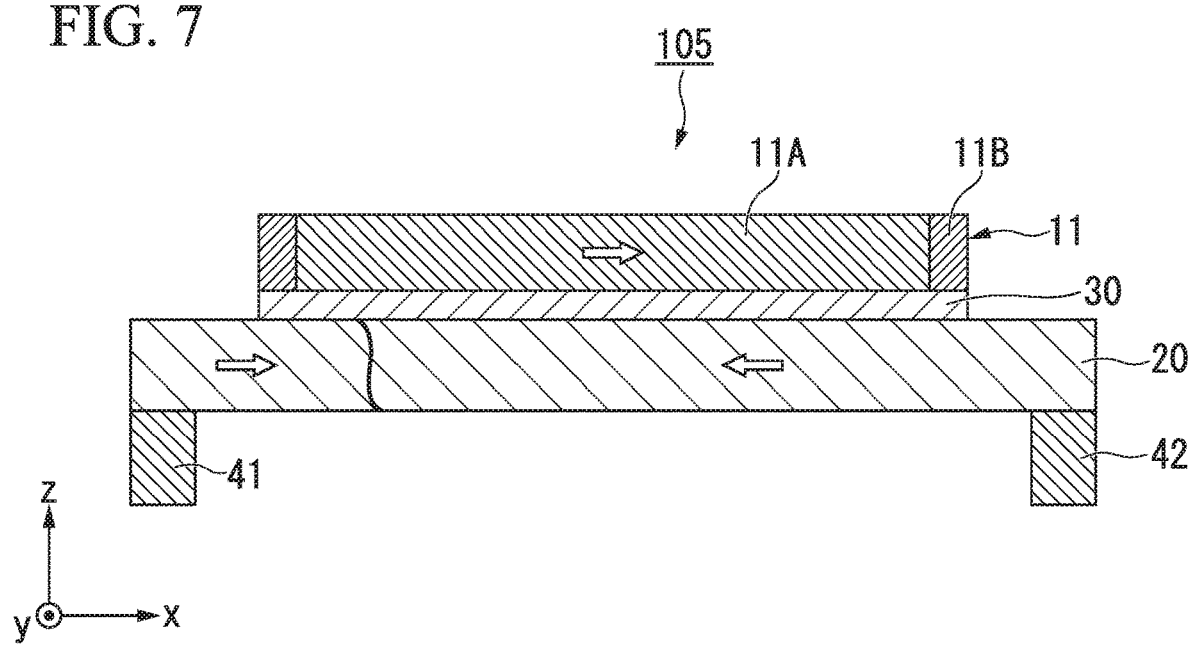
FIG. 7 is a cross-sectional view schematically showing a magnetic domain wall displacement type magnetic recording element according to a second embodiment.

FIG. 7 is a schematic sectional view of a magnetic domain wall displacement type magnetic recording element 105 according to a second embodiment. The magnetic domain wall displacement type magnetic recording element 105 shown in FIG. 7 is different from the magnetic domain wall displacement type magnetic recording element 100 shown in FIG. 1 in a constitution of a first ferromagnetic layer 11. Other constitutions are the same as those of the magnetic domain wall displacement type magnetic recording element 100 shown in FIG. 1, and the same components are designated by the same reference numerals.

The first ferromagnetic layer 11 shown in FIG. 7 has a main region 11A located at a center of the first ferromagnetic layer 10 in the x direction, and an end region 11B located at an end thereof. The end region 11B and the main region 11A are formed of different materials. Therefore, the intensity of the magnetic field generated in the main region 11A is different from the intensity of the magnetic field generated in the end region 11B. The end region 11B becomes the magnetic flux supply region B.

The same materials as that of the first layer 1 and the second layer 2 can be used as materials constituting the main region 11A and the end region 11B. The materials of the main region 11A and the end region 11B are selected so that the intensity of the magnetic field generated by the end region 11B is larger than the intensity of the magnetic field generated by the main region 11A.

When the intensity of the magnetic field generated by the main region 11A and the intensity of the magnetic field generated by the end region 11B are different from each other, the magnetic potential distribution is generated in the magnetic recording layer 20. The magnetic potential distribution changes easiness of movement of the magnetic domain wall 21 and controls the movement range of the magnetic domain wall 21.

Figure 8:
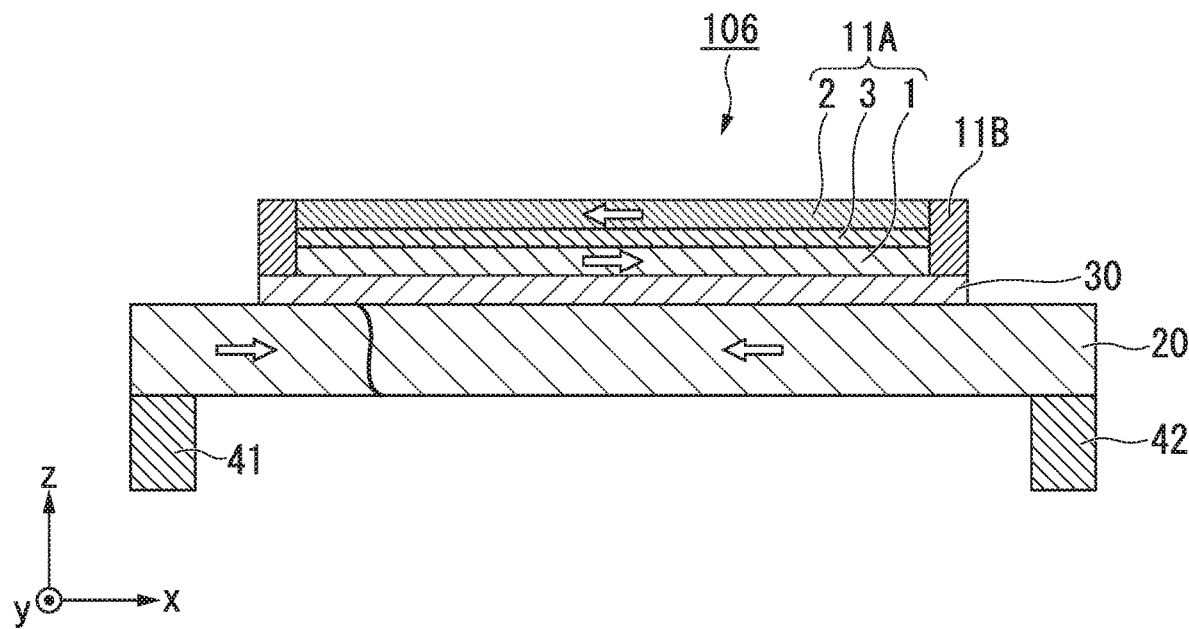
FIG. 8 is a cross-sectional view schematically showing another example of the magnetic domain wall displacement type magnetic recording element according to the second embodiment.

Also, FIG. 8 is a schematic cross-sectional view of another example of the magnetic domain wall displacement type magnetic recording element according to the second embodiment. Like the magnetic domain wall displacement type magnetic recording element 106 shown in FIG. 8, the main region 11A may have a three-layer structure including a first layer 1, a second layer 2, and an intermediate layer 3.

Also in the magnetic domain wall displacement type magnetic recording element according to the second embodiment, the first ferromagnetic layer 10 and the magnetic recording layer 20 may be the perpendicular magnetization films, and the laminating order of the first ferromagnetic layer 10, the magnetic recording layer 20, and the nonmagnetic layer 30 may be reversed.

As described above, according to the magnetic domain wall displacement type magnetic recording elements 105 and 106 according to the second embodiment, the magnetic potential distribution can be generated in the magnetic recording layer 20. As a result, the movement range of the magnetic domain wall 21 is limited to a predetermined range, and the sensitivity to the input signals of the magnetic domain wall displacement type magnetic recording elements 105 and 106 can be increased.

Third Embodiment

Figure 9:
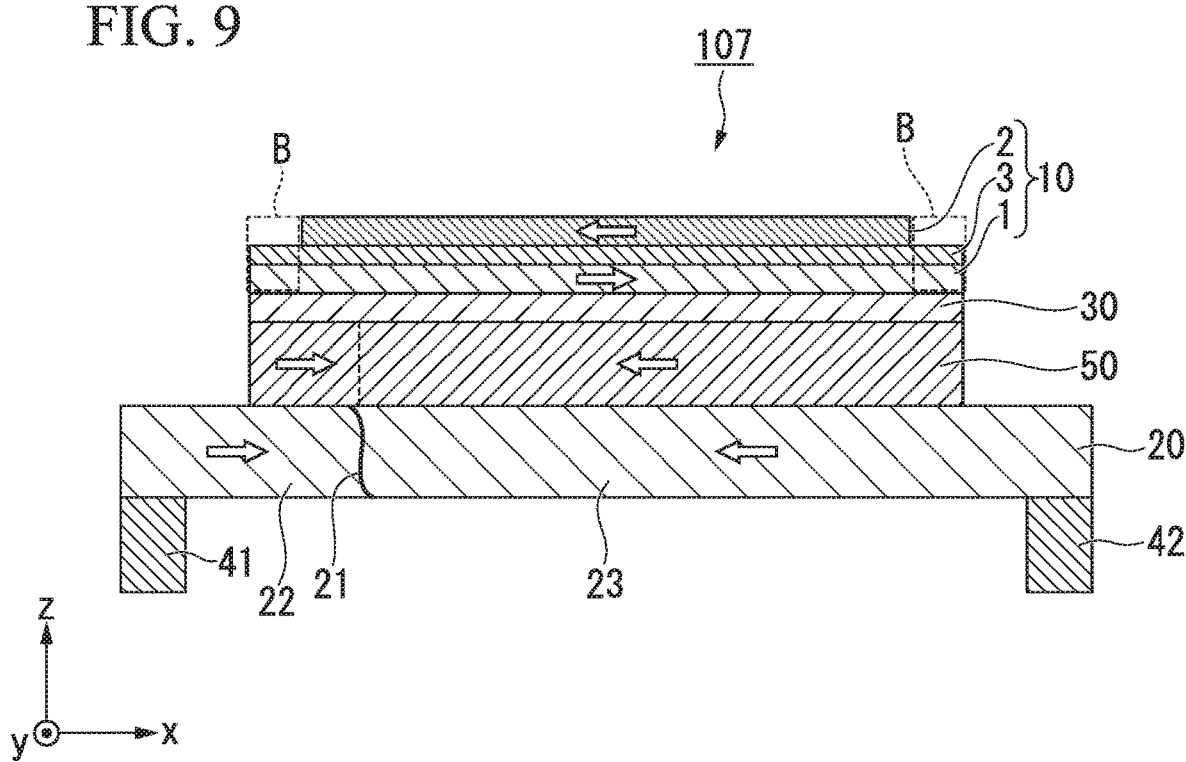
FIG. 9 is a cross-sectional view schematically showing a magnetic domain wall displacement type magnetic recording element according to a third embodiment.

FIG. 9 is a schematic cross-sectional view of a magnetic domain wall displacement type magnetic recording element 107 according to a third embodiment. The magnetic domain wall displacement type magnetic recording element 107 shown in FIG. 9 is different from the magnetic domain wall displacement type magnetic recording element 100 according to the first embodiment in that a second ferromagnetic layer 50 is provided between the magnetic recording layer 20 and the nonmagnetic layer 30. Components similar to those of the magnetic domain wall displacement type magnetic recording element 100 according to the first embodiment are designated by the same reference numerals, and a description thereof will be omitted.

Here, an example in which the second ferromagnetic layer 50 is provided between the magnetic recording layer 20 and the nonmagnetic layer 30 of the magnetic domain wall displacement type magnetic recording element 100 will be described as a basic example. However, the present invention is not limited to this constitution and may have the same constitution in other magnetic domain wall displacement type magnetic recording elements according to the first embodiment and the magnetic domain wall displacement type magnetic recording element according to the second embodiment.

The second ferromagnetic layer 50 includes a magnetic material. The same magnetic materials as those of the first layer 1 and the second layer 2 of the first ferromagnetic layer 10 can be used as the magnetic material constituting the second ferromagnetic layer 50.

The second ferromagnetic layer 50 is adjacent to the magnetic recording layer 20. The magnetization of the second ferromagnetic layer 50 is magnetically coupled with the magnetization of the magnetic recording layer 20. Therefore, the second ferromagnetic layer 50 exhibits a magnetic state of the magnetic recording layer 20. When the second ferromagnetic layer 50 and the magnetic recording layer 20 are ferromagnetically coupled, the magnetic state of the second ferromagnetic layer 50 is the same as the magnetic state of the magnetic recording layer 20, and when the second ferromagnetic layer 50 and the magnetic recording layer 20 are antiferromagnetically coupled, the magnetic state of the second ferromagnetic layer 50 is opposite to the magnetic state of the magnetic recording layer 20.

When the second ferromagnetic layer 50 is inserted between the magnetic recording layer 20 and the nonmagnetic layer 30, the second ferromagnetic layer 50 and the magnetic recording layer 20 can separate functions shown in the magnetic domain wall displacement type magnetic recording element 107. An MR ratio of the magnetic domain wall displacement type magnetic recording element 107 is generated by a change in the magnetization state of the two magnetic materials (the first layer 1 and the second ferromagnetic layer 50) sandwiching the nonmagnetic layer 30. Therefore, the function of improving the MR ratio can be mainly assigned to the second ferromagnetic layer 50, and the function of moving the magnetic domain wall 21 can be mainly assigned to the magnetic recording layer 20.

A degree of freedom of the magnetic material constituting each of them is increased by separating the functions of the second ferromagnetic layer 50 and the magnetic recording layer 20. A material capable of obtaining a coherent tunnel effect with the first ferromagnetic layer 10 can be selected for the second ferromagnetic layer 50, and a material causing the movement speed of the magnetic domain wall to be slow can be selected for the magnetic recording layer 20.

As described above, also in the magnetic domain wall displacement type magnetic recording element 107 according to the third embodiment, the movement range of the magnetic domain wall 21 can be limited to a portion which overlaps the first ferromagnetic layer 10 when seen in the z direction. Therefore, the relationship between the movement of the magnetic domain wall 21 and the change in the data output from the magnetic domain wall displacement type magnetic recording element 107 is strengthened, and the sensitivity to an input signal of the magnetic domain wall displacement type magnetic recording element 107 can be increased.

Also, a degree of freedom in selecting the magnetic material or the like can be increased by separating the functions of the second ferromagnetic layer 50 and the magnetic recording layer 20 which are performed in the magnetic domain wall displacement type magnetic recording element 107. Further, the MR ratio of the magnetic domain wall displacement type magnetic recording element 107 can be further increased by increasing the degree of freedom in selecting the material.

Figure 10:
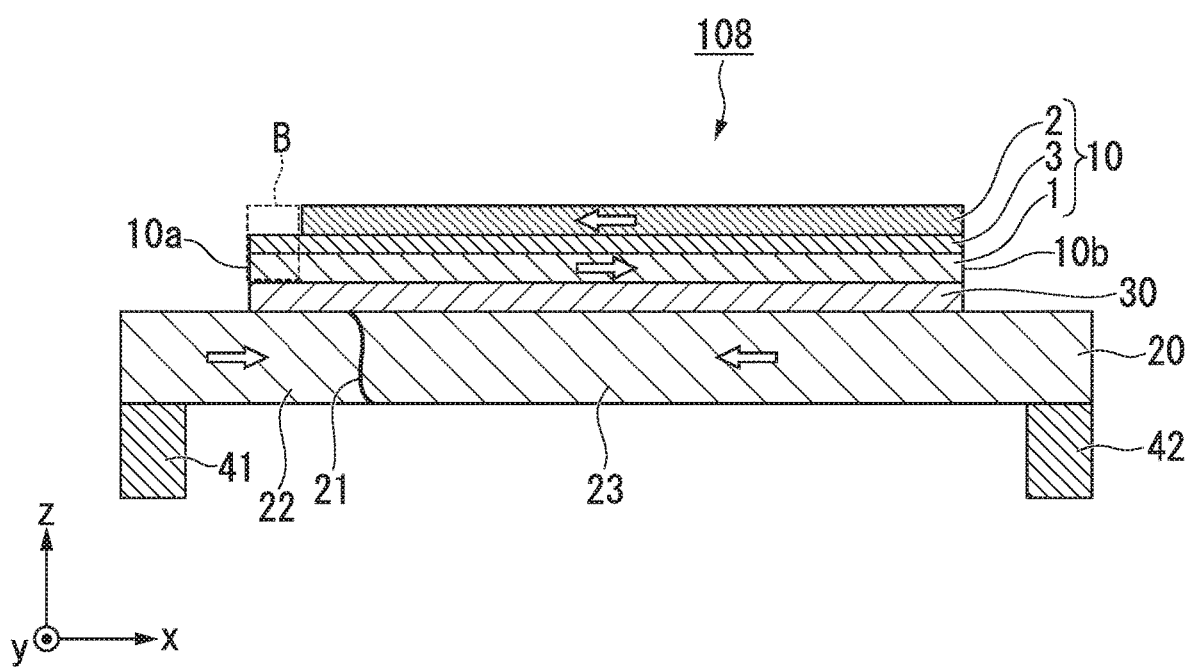
FIG. 10 is a schematic cross-sectional view of a magnetic domain wall displacement type magnetic recording element having a magnetic flux supply region only at a first end.

As described above, in the first to third embodiments, the case in which the magnetic flux supply region B is provided at both ends of the first ferromagnetic layer 10 has been exemplified, but the magnetic flux supply region B may be provided only at one of the ends. FIG. 10 is a schematic cross-sectional view of the magnetic domain wall displacement type magnetic recording element 108 including the magnetic flux supply region B only at the first end 10*a*. When the magnetic flux supply region B is provided at either end, the movement of the magnetic domain wall 21 can be limited within a predetermined range as compared with a case in which the magnetic flux supply region B is not provided.

Fourth Embodiment

Figure 11:
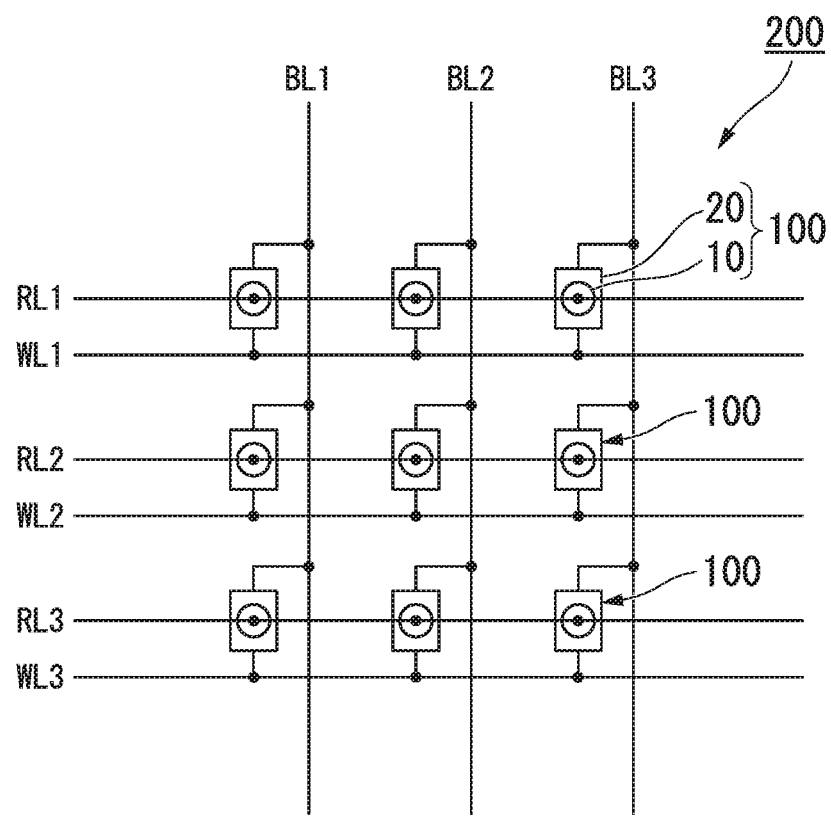
FIG. 11 is a plan view of a magnetic recording array according to a fourth embodiment.

FIG. 11 is a plan view of a magnetic recording array 200 according to a fourth embodiment. In the magnetic recording array 200 shown in FIG. 11, the magnetic domain wall displacement type magnetic recording element 100 has a 3×3 matrix arrangement. FIG. 11 shows an example of the magnetic recording array, and the type, the number and the arrangement of the magnetic domain wall displacement type magnetic recording elements are arbitrary.

One word line WL1 to WL3, one bit line BL1 to BL3, and one read line RL1 to RL3 are connected to the magnetic domain wall displacement type magnetic recording element 100.

A pulse current is supplied to the magnetic recording layer 20 of an arbitrary magnetic domain wall displacement type magnetic recording element 100 and a write operation is performed by selecting the word line WL1 to WL3 and the bit line BL1 to BL3 to which a current is applied. Further, a current flows in the laminating direction of an arbitrary magnetic domain wall displacement type magnetic recording element 100 and a reading operation is performed by selecting the read line RL1 to RL3 and the bit line BL1 to BL3 to which a current is applied. The word lines WL1 to WL3, the bit lines BL1 to BL3, and the read lines RL1 to RL3 to which a current is applied can be selected by transistors or the like. It is possible to realize a high capacity of the magnetic recording array by recording data in a plurality of magnetic domain wall displacement type magnetic recording elements 100 each capable of recording information with multiple values.

Although the preferred embodiments of the present invention have been described in detail above, the present invention is not limited to the specific embodiments, and various modifications and changes are possible within the scope of the gist of the present invention described in claims.

EXPLANATION OF REFERENCES

1 First layer
2 Second layer
3 Intermediate layer
10, 11 First ferromagnetic layer
10*a* First end
10*b* Second end
11A Main region
11B End region
20 Magnetic recording layer
21 Magnetic domain wall
22 First magnetic domain
23 Second magnetic domain
25, 26 Region
30 Nonmagnetic layer
41 First via wiring
42 Second via wiring
50 Second ferromagnetic layer
100, 101, 102, 103, 104, 105, 106, 107, 108 Magnetic domain wall displacement type magnetic recording element
200 Magnetic recording array
B Magnetic flux supply region

What is claimed is:

1. A magnetic domain wall displacement type magnetic recording element comprising:
   a first ferromagnetic layer including a ferromagnetic material;
   a magnetic recording layer configured to extend in a first direction crossing a laminating direction of the first ferromagnetic layer and including a magnetic domain wall; and
   a nonmagnetic layer sandwiched between the first ferromagnetic layer and the magnetic recording layer,
   wherein the first ferromagnetic layer has a magnetic flux supply region at least at a first end in the first direction, and
   a second ferromagnetic layer exhibiting a magnetization state of the magnetic recording layer is provided between the magnetic recording layer and the nonmagnetic layer.

2. The magnetic domain wall displacement type magnetic recording element according to claim 1, wherein the first ferromagnetic layer has a magnetic flux supply region at the first end and a second end opposite to the first end.

3. The magnetic domain wall displacement type magnetic recording element according to claim 1, wherein the magnetic flux supply region includes a material different from that of a main region located at a center of the first ferromagnetic layer in the first direction.

4. The magnetic domain wall displacement type magnetic recording element according to claim 1, wherein the first ferromagnetic layer includes a first layer and a second layer, which are made of ferromagnetic materials and have mutually different magnetization directions, and an intermediate layer sandwiched between the first layer and the second layer, and
   an area occupied by the first layer and an area occupied by the second layer are different from each other in a cutting plane obtained by cutting the magnetic flux supply region through a center of gravity of the first ferromagnetic layer in the first direction.

5. The magnetic domain wall displacement type magnetic recording element according to claim 4, wherein the first layer is located closer to the magnetic recording layer than the second layer is, and
   a length of the first layer is longer than a length of the second layer.

6. The magnetic domain wall displacement type magnetic recording element according to claim 4, wherein the first layer is located closer to the magnetic recording layer than the second layer is, and
a length of the second layer is longer than a length of the first layer.

7. The magnetic domain wall displacement type magnetic recording element according to claim 4, wherein the first layer and the second layer protrude stepwise in the first direction, and a side surface of the first ferromagnetic layer is stepped in the first direction.

8. The magnetic domain wall displacement type magnetic recording element according to claim 4, wherein the side surface of the first ferromagnetic layer is an inclined surface in the first direction.

9. The magnetic domain wall displacement type magnetic recording element according to claim 1, wherein the first ferromagnetic layer and the magnetic recording layer have magnetic anisotropy in the laminating direction.

10. The magnetic domain wall displacement type magnetic recording element according to claim 1, wherein the first ferromagnetic layer and the magnetic recording layer have magnetic anisotropy in in-plane directions of the first ferromagnetic layer and the magnetic recording layer.

11. A magnetic recording array comprising a plurality of the magnetic domain wall displacement type magnetic recording elements according to claim 1.

* * * * *